(12) United States Patent
Wemmer et al.

(10) Patent No.: US 8,570,035 B2
(45) Date of Patent: Oct. 29, 2013

(54) MAGNETIC RESONANCE IMAGING OF LIVING SYSTEMS BY REMOTE DETECTION

(75) Inventors: David Wemmer, Berkeley, CA (US); Alexander Pines, Berkeley, CA (US); Louis Bouchard, Los Angeles, CA (US); Shoujun Xu, Houston, TX (US); Elad Harel, Chicago, IL (US); Dmitry Budker, El Cerrito, CA (US); Thomas Lowery, Berkeley, CA (US); Micah Ledbetter, Oakland, CA (US)

(73) Assignee: The Regents of the University of California, Oakland, CA (US)

( * ) Notice: Subject to any disclaimer, the term of this patent is extended or adjusted under 35 U.S.C. 154(b) by 573 days.

(21) Appl. No.: 12/747,488

(22) PCT Filed: Dec. 12, 2008

(86) PCT No.: PCT/US2008/086646
§ 371 (c)(1),
(2), (4) Date: Sep. 23, 2010

(87) PCT Pub. No.: WO2009/097053
PCT Pub. Date: Aug. 6, 2009

(65) Prior Publication Data
US 2011/0001478 A1    Jan. 6, 2011

Related U.S. Application Data

(60) Provisional application No. 61/013,951, filed on Dec. 14, 2007.

(51) Int. Cl.
*G01V 3/00* (2006.01)
(52) U.S. Cl.
USPC ............................................. 324/309

(58) Field of Classification Search
USPC ................................. 324/300–322
See application file for complete search history.

(56) References Cited

U.S. PATENT DOCUMENTS

| | | | | |
|---|---|---|---|---|
| 5,285,158 A | * | 2/1994 | Mistretta et al. | 324/309 |
| 5,592,085 A | * | 1/1997 | Ehman | 324/309 |
| 5,671,742 A | * | 9/1997 | Dumoulin et al. | 324/318 |
| 5,977,770 A | * | 11/1999 | Ehman | 324/318 |

(Continued)

OTHER PUBLICATIONS

Xu et al., "Magnetic resonance imaging with an optical atomic magnetometer," Proceedings of the National Academy of Sciences, vol. 103, No. 34, pp. 12668-12671, (Aug. 22, 2006).

(Continued)

*Primary Examiner* — Dixomara Vargas
(74) *Attorney, Agent, or Firm* — Lawrence Berkeley National Laboratory

(57) ABSTRACT

A novel approach to magnetic resonance imaging is disclosed. Blood flowing through a living system is prepolarized, and then encoded. The polarization can be achieved using permanent or superconducting magnets. The polarization may be carried out upstream of the region to be encoded or at the place of encoding. In the case of an MRI of a brain, polarization of flowing blood can be effected by placing a magnet over a section of the body such as the heart upstream of the head. Alternatively, polarization and encoding can be effected at the same location. Detection occurs at a remote location, using a separate detection device such as an optical atomic magnetometer, or an inductive Faraday coil. The detector may be placed on the surface of the skin next to a blood vessel such as a jugular vein carrying blood away from the encoded region.

25 Claims, 3 Drawing Sheets

(56) References Cited

U.S. PATENT DOCUMENTS

| | | | |
|---|---|---|---|
| 6,310,479 B1 * | 10/2001 | Zhu et al. .................... | 324/312 |
| 6,518,759 B2 * | 2/2003 | Bernstein .................... | 324/307 |
| 6,807,441 B2 * | 10/2004 | Schmainda ................ | 600/424 |
| 7,371,365 B2 * | 5/2008 | Poduslo et al. ............ | 424/9.34 |
| 2006/0244446 A1 | 11/2006 | Dewdney et al. | |
| 2007/0205767 A1 | 9/2007 | Xu et al. | |

OTHER PUBLICATIONS

Hills et al., "A low-field, low-cost Halbach magnet array for open-access NMR," Journal of Magnetic Resonance, vol. 175, pp. 336-339, (2005).

Unsolicited Research Proposal for Earths Field MRI Scanner Based on Laser-Atomic Magnetometer, submitted to DARPA Jul. 13, 2007 [First 24 of 46 pages].

Unpublished paper entitled Laser-detected Magnetic Resonance Imaging for Medicine, Inventors: Alexander Pines, et al [3 pages].

Unpublished paper entitled Magnetic Resonance Imaging of Living Systems by Remote Detection, Inventors: Alexander Pines, et. al, [5 pages].

International Search Report and Written Opinion for International Application No. PCT/US08/86646 mailed Jun. 29, 2009.

* cited by examiner

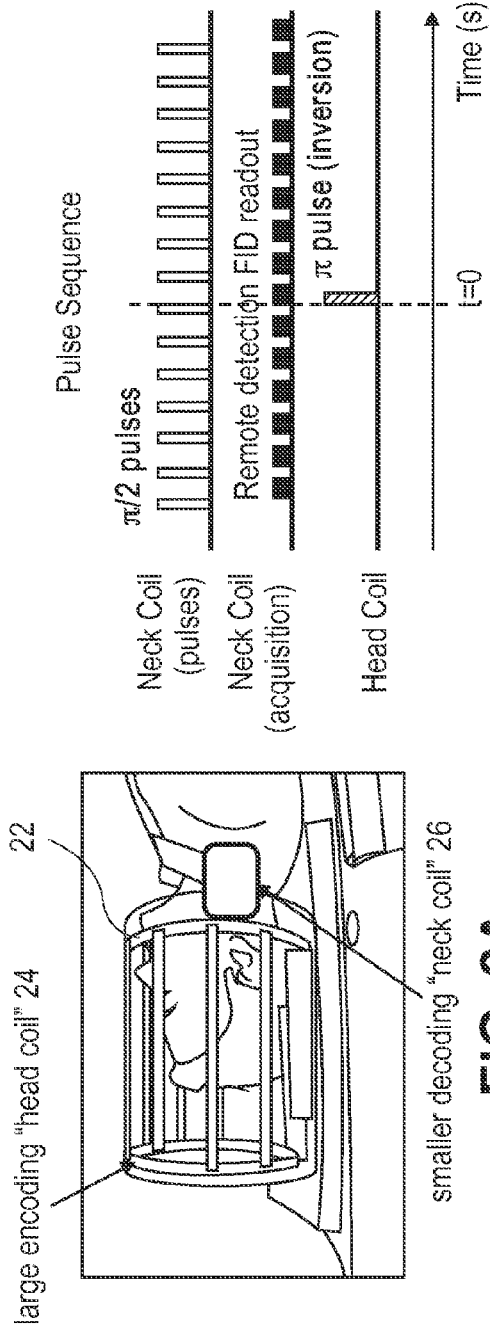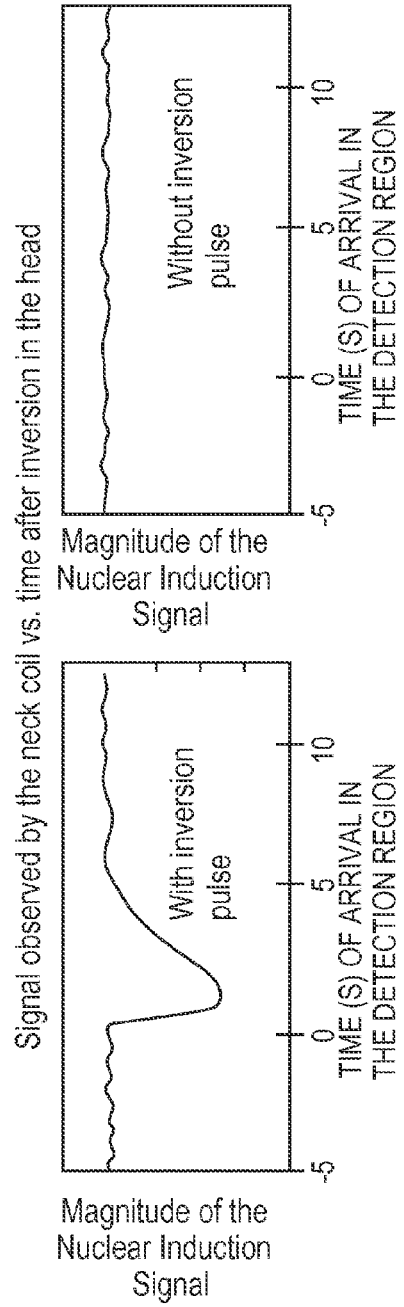
FIG. 2A
FIG. 2B
FIG. 2C
FIG. 2D

MAGNETIC RESONANCE IMAGING OF LIVING SYSTEMS BY REMOTE DETECTION

RELATED APPLICATIONS

The application claims the benefit of priority to PCT Application PCT/US2008/086646, filed on Dec. 12, 2008, which in turn claims priority to U.S. Provisional Application No. 61/013,951, filed on Dec. 14, 2007, both of which prior applications are hereby incorporated herein by reference, as if fully set forth in their entirety.

STATEMENT OF GOVERNMENTAL SUPPORT

The invention was made with government support under Contract No. DE-AC02-05CH11231 awarded by the U.S. Department of Energy to the Regents of the University of California for the operation and maintenance of the Lawrence Berkeley National Laboratory. The government has certain rights in this invention.

BACKGROUND OF THE INVENTION

1. Field of the Invention

This invention relates generally to nuclear magnetic resonance (NMR) imaging (MRI) of living systems, and, more particularly to a method for remote NMR imaging of such living systems, remote detection affording potentially greater resolution of the areas being imaged, and facilitating the creation of portable MRI devices.

2. Background of the Invention

Conventional medical MRI requires a strong magnetic field provided by a superconducting magnet in order to obtain good sensitivity and spatial resolution. Such MRI equipment requires cryogenic support, and accordingly it is stationary, and must be used in a hospital-like setting. In addition, because the superconducting magnets, as well as the RF and gradient coils which are required for three dimensional imaging must be large enough to accommodate the subject to be imaged, and because of the dimensional issues involved, resolution of the imaged areas deep inside the body can be less than optimum.

One of the drawbacks of conventional NMR in medical imaging is the low filling factor. The filling factor relates to the size of the area to be interrogated by NMR compared to the area viewed by the sensor. The smaller the filling factor, the less detailed the image. In interrogating a voxel (a unit of volume, generally around 1 mm$^3$), of a section of living tissue such as the brain, for example, both the magnet and the detector coils are spaced some distance from the subject section. As is apparent from consideration of looking at a portion of the inner brain, the volume of the voxel is quite small in relationship to the volume within the space contained by the sensor. While fairly good readings can be obtained at voxels near the outer reaches of the brain, just underneath the skull, using (for example) a surface coil, getting accurate readings of voxels deeper within the brain is problematic. Thus, if one could bring the sensor closer to the area to be interrogated, it would be possible to increase the filling factor and thus sensitivity.

In addition to sensitivity, conventional MRI (most commonly employing large superconducting magnets of high magnetic field) is not always suitable for at least the following: a) patients with metal implants; b) claustrophobic patients and infants; and c) patients under constant monitoring by electronic devices. In addition, the expense and immobility of the MRI apparatus (most importantly the magnet) make it inapplicable in many circumstances, including third world countries and for medical practices outside of hospitals. The cryogenics associated with the superconducting magnets contribute substantially to the high maintenance and initial cost of MRI instruments. Any approach to MRI that does not require high, homogeneous magnetic fields and that uses a simpler approach for detection would significantly expand the applicability of this analytical approach.

SUMMARY OF THE INVENTION

By way of this invention, a means has been found to address both the MRI sensitivity issue as well as the cost and portability issue. Thus as opposed to conventional NMR/MRI imaging, where the filling factor is low when detecting fluctuations in nuclear magnetization measured in deep-seated tissues distant from the sensor, in the instant invention the nuclear spins in a region are excited with RF (or AF) pulses, encoded using chemical shift and/or imaging gradients (as longitudinal magnetization, i.e., along the applied magnetic field), and the spins then physically transferred to a separate region where magnetization is read out. This transport, which may occur over a period of 1 to several seconds, is possible because of the storage step. Because there is a much more effective coupling of the spins at the detector in the optimized detection region, where the filling factor is much greater, the sensitivity of afforded detection is much higher. Moreover, if magnetic flux detection is used at the detector, an acquisition-bandwidth advantage is obtained due to the longer $T_1$ (longitudinal relaxation time) values compared to $T_2$ (transverse relaxation time) values. By repeated cycles of frequency encoding and readout, the frequencies (for spectroscopy) or the spatial distribution of spins (for imaging) can be deduced. In addition, by using highly sensitive detectors it is possible to do low field imaging, with the attendant elimination of the need for the high field superconducting magnets of conventional MRI.

Two separate embodiments are now discussed. In a first, exemplary for MRI of the brain, the head of the subject is placed within a typical MRI assembly such as one commonly found at hospitals and outpatient clinics. In this embodiment, the blood within the brain is polarized by the $B_0$ field of the magnet, and the nuclear spins are encoded using a combination of RF, magnetic-field gradient pulses and spin evolution, applied to a selected volume. Encoding may be concluded with storage of the encoded nuclear spins as longitudinal magnetization. Once encoded, the blood continues its flow through and from the brain to a remote sensor, with typical transport times to the sensor of anywhere from a few to ten or more seconds.

In a second embodiment, one more suitable for portable NMR applications, the blood is prepolarized in a region upstream of the brain, such as the heart using a permanent magnet such as a Halbach magnet array. In such a magnet, the magnetic field is strongly focused over a region of interest, resulting in maximal flux over that region, and minimal losses of flux to the regions outside the desired region. In this embodiment, the magnet being a permanent or electro magnet, the encoding step is performed at the head of the subject in the presence of the constant magnetic field, thus eliminating the need for a superconducting magnet. A typical RF head coil arrangement may be used for encoding. In this mode, encoding can be non selective (without any gradient applied), or selective, with one or more dedicated surface coils placed strategically as to cover a desired region. In this embodiment employing small permanent magnets, a degree of portability is afforded not otherwise possible.

In the remote detection mode, the travel time of pre-polarized blood to the brain and then to the jugular can be as much as 20 seconds, during which time there is a loss of magnetization. Thus after encoding, by the time the encoded blood reaches the sensor, there has been a substantial decrease in magnetization and thus potential signal strength.

Accordingly highly sensitive detectors are required. In an embodiment of the invention, laser-based atomic magnetometers that dramatically outperform conventional inductive coupling sensors at low frequencies can be used. Alternatively, anisotropic magnetoresistive (AMR) sensors or any other sensitive magnetometer can also be used. In addition to the benefits of cost, size and portability, low field imaging is potentially much more benign to patients with metallic inclusions such as shrapnel, and/or artificial joint implants.

BRIEF DESCRIPTION OF THE DRAWINGS

The foregoing aspects and others will be readily appreciated by the skilled artisan from the following description of illustrative embodiments when read in conjunction with the accompanying drawings.

FIG. 2A is an illustration showing another embodiment of the invention, along with the depiction of a pulse sequence for neck and head coils (FIG. 2B), and a sketch of an expected time course plot of a measured signal in a hypothetical experiment (FIGS. 2C and 2D).

DETAILED DESCRIPTION OF THE INVENTION

Figure 1:
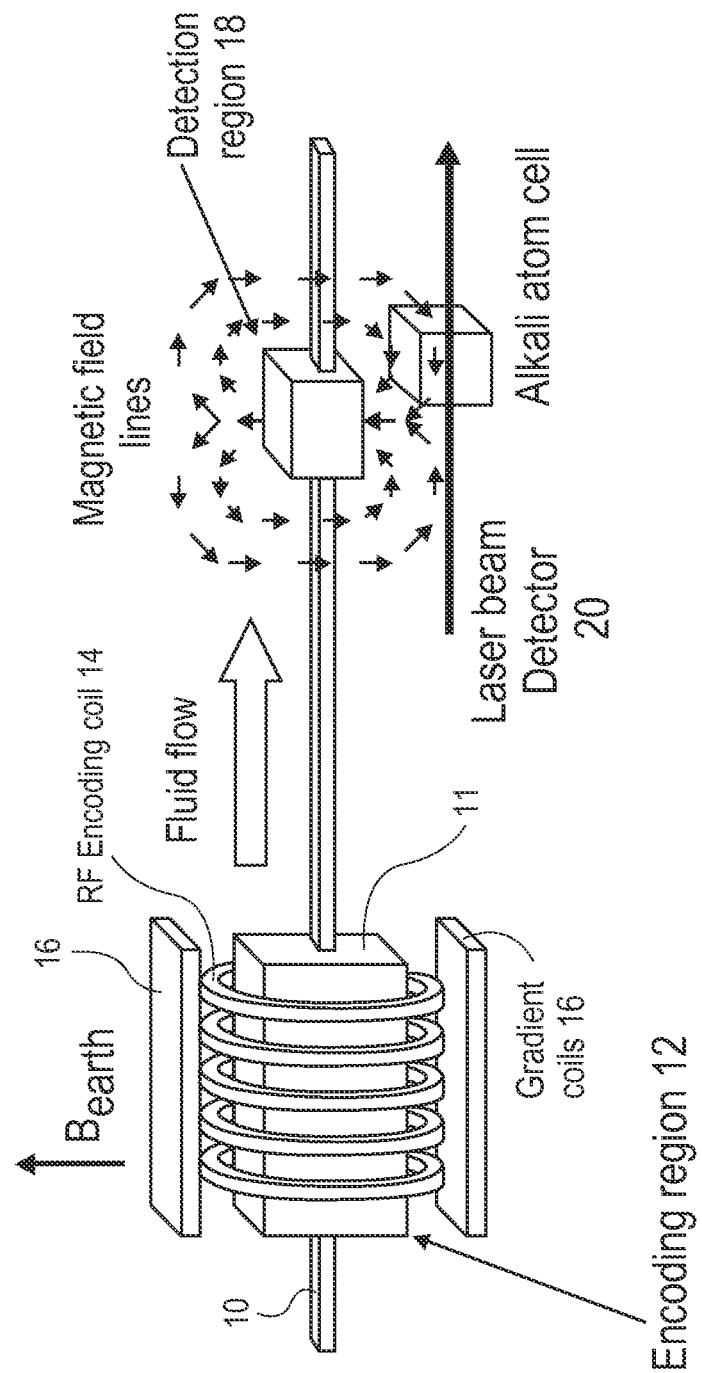
FIG. 1 is a schematic diagram showing an embodiment of the invention, for the case of detection by atomic magnetometry.

Presented herein is a novel approach to magnetic resonance imaging (MRI) of living systems which provides complementary information about morphology and flow not normally obtained with convention MRI. This approach measures flow by the time of arrival of the flowing substance at a remote location, using a detector placed at a remote location. It can also be used for three dimensional imaging. In an embodiment, the method of this invention is particularly well suited for example for MRI of the brain.

The flow of blood is one of the most important properties of, and a critical process in living animals. It regulates temperature, nutrition and function of the tissues, providing critical nutrients and oxygen, and removing waste $CO_2$ and other metabolites. Understanding blood flow and changes in it is important for understanding both normal functions and disease processes. MRI is one of the best available methods to date to provide information about blood flow in the brain. Despite the significant advantages of MRI, current MRI methodologies are still unable to resolve voxels smaller than a few hundreds of micrometers, and conventional MRI images provide at best a convolution of information about anatomy, flow, oxygenation and remote flow effects.

By the methods of this invention, information about blood flow in the human or animal brain is provided, with detection made downstream from the brain, carrying with it time of flight and dispersion information, which may be useful clinically. This remote detection method requires pre-polarization of blood in the head, heart or elsewhere on the upstream arterial blood path of the region to be imaged. Thereafter, flow can be measured by its time of arrival at a remote location, using a dedicated detector placed at the remote location, the detector measuring changes in the nuclear spin magnetization exhibited by flowing spins after some time of travel.

In the context of this invention for medical applications the spins in the sample can be protons in the water of the body fluids, or externally polarized spins that are transferred into body fluids such as blood. In the case of using endogenous water, the protons are polarized by exposure to a region of relatively high magnetic field (which needs not be very homogeneous) and in one embodiment can be provided by small, inexpensive permanent magnets. These spins (whether protons or other exogenous spins) flow into the region of the sample to be imaged by the natural flow of the circulatory system through arteries and their successive divisions into small blood supply vessels. The polarized spins are then encoded using MRI methods in a static field (which could be quite low) with or without the application of magnetic-field gradients. Encoding is typically concluded with storage as longitudinal magnetization, to enable transit of the blood to the detector (which may take several seconds). The storage as longitudinal magnetization rotates spins, via an applied pulse, so that the magnetization is along the direction of the leading magnetic field. Such longitudinal magnetization has a characteristic decay time $T_1$, which is typically much longer than the decay time of transverse magnetization $T_2$, and is thus better for storage of the encoded information. The encoded spins continue to flow into the venous blood system, collecting into the large veins. The magnetization of spins in such veins near the surface of the body can then be detected using sensitive laser magnetometers, or surface coils (as further described below).

A critical aspect of the approach of this invention is that the readout of the magnetization from the original distribution of spins requires a very high level of sensitivity. Such increased sensitivity is achieved in large part by being able to place the sensor(s) into close proximity to the spins to be detected. Further enhancing sensitivity is the use of high sensitivity detectors such as surface induction coils (with focused field), optical atomic magnetometers, and magnetoresistive magnetometers. Superconducting quantum interference device (SQUID) magnetometers may also be used. With magnetometer detection, it is the flux (i.e., the longitudinal magnetization) that is measured directly, as opposed to conventional NMR measurements where RF pulses are used to convert longitudinal magnetization into observable transverse magnetization before detection. Thus, with flux detection, continuous monitoring is possible, with additional benefits of higher sensitivity.

With reference to FIG. 1, a schematic of a remote detection system, blood flowing through the body, represented by blood stream 10 is brought to the area of interrogation 11, for example the brain, where it is encoded in encoding region 12 in the presence of a magnetic field. Encoding coil 14 can be a conventional MRI head coil of the type commercially available with clinical MRI scanners. In the case of high field detection, the encoding region is positioned typically within the bore of a superconducting magnet (not shown) having a magnetic field strength of anywhere from 0.5-3 Tesla, and up to 9 Tesla. In the case of low field detection, magnetization is achieved in a region separate from the encoding region, as will hereafter be discussed. Remote detection is achieved in the case of high field applications with most preferably an induction coil type of Faraday sensor. For low field applications more sensitive detectors are employed such as an optical magnetometer, item 20 of FIG. 1.

Remote Detection in High Fields

In a non-portable application, such as in a hospital setting using traditional large MRI scanners, a superconducting magnet is used to polarize the nuclear spins (typically, over the entire living body). In this mode, the subject is first placed within the bore of the magnet, and all blood within the bore is pre-magnetized along the $B_0$ (static) field of the magnet. The spins of the nuclei are then encoded by the application of RF or gradient pulses, depending upon the type of information sought (for example, blood flow, image of a select volume (voxel) within the body, etc.).

For such high field applications, it has been demonstrated that a suitable detector for downstream detection is an RF coil, such as a tuned circuit operating by Faraday induction. Here the strength of the magnetic field of the flowing fluid sets up a voltage within the coil, the variations in the induced voltage detected and recorded. To be able to properly align the spins so that they may be detected, it is necessary to apply an RF pulse with the encoding coil. Detection may utilize a train of RF pulses followed by acquisition of the nuclear induction signal. (See for example the pulse sequence depicted in FIG. 2B). Other variants of this pulse sequence are also possible and not shown here.

Figure 3A:
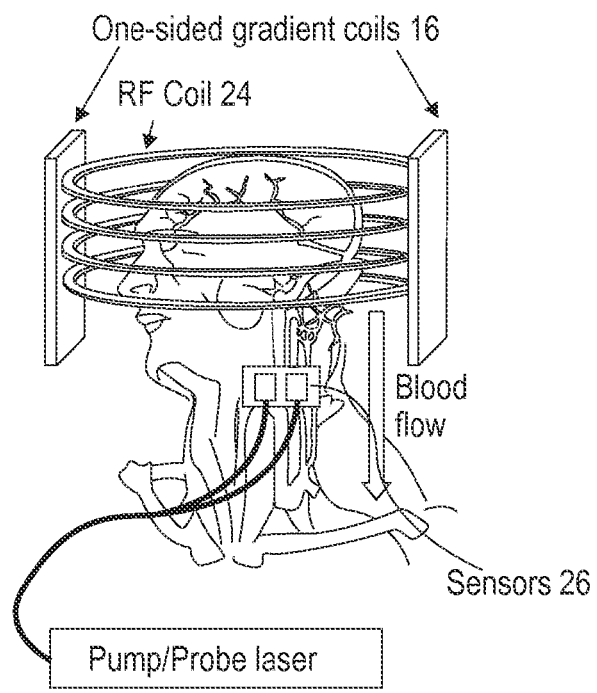
FIG. 3A is an illustration of an embodiment of the invention showing placement of atomic magnetometer sensors, and 3B an illustration of an embodiment of the invention illustrating the placement of permanent magnets for the pre-polarization of flowing blood located upstream from the head.

The RF coil of the sensor is a small transmit/receive coil sized in such a way that its field is well focused over the jugular vein, in order to provide better sensitivity to the blood flow through the jugulars. The detector coil may also be a phased-array coil or a single loop coil, or any other coil design that is optimized to provide strong signals from one or more of the jugulars. The construction and operation of Faraday coil detectors for MRI is well known in the art of MRI, and thus they will not be further discussed herein. In use, the coil or coils are positioned on the skin of the neck, in proximity to the jugulars and aligned either with the exterior or interior jugular vein or both (as illustrated in FIG. 3A). Acquisition of the signal may or may not be done in the presence of a magnetic field gradient. Detection of the signal in the presence of a magnetic field gradient, however, offers the potential advantages of increase sensitivity and speed-ups in the generation of multi-dimension experiments.

FIGS. 2C and 2D are illustrative of expected signal vs. time plots of intensities acquired over a period of time both before and after encoding, using repeated readouts in a neck coil. The encoding can be any excitation or inversion of the nuclear magnetization in a volume in the brain. When the encoded spins arrive in the detector region, a change in signal may be observed. The hypothetical results of FIGS. 2C and 2D show what would be expected using a large encoding head coil 24 like that of FIG. 2A in combination with a smaller decoding neck coil 26. At detector coil 26 signal intensities are acquired over periods of time, with repeated RF pulses applied to the neck coil, the transmitted train of Π/2 pulses used to equilibrate the magnetization. In FIG. 2C no modulations are seen as this hypothetical experiment measures only the background signal with no inversion pulse applied. In FIG. 2D the same hypothetical experiment is conducted, except that an inversion pulse is applied using the head coil. As the inverted nuclei first reach and the flow through the jugular veins and past neck coil 26, they are pulsed into the transverse plane and a subsequent change in the FID is obtained. The observed change in the signal caused by the arrival of the head encoded nuclei appears and can last for several seconds. The shape of the change and the timing of the change carries information (such as dispersion) about the blood flow.

Remote Detection in Low Fields

Figure 3B:
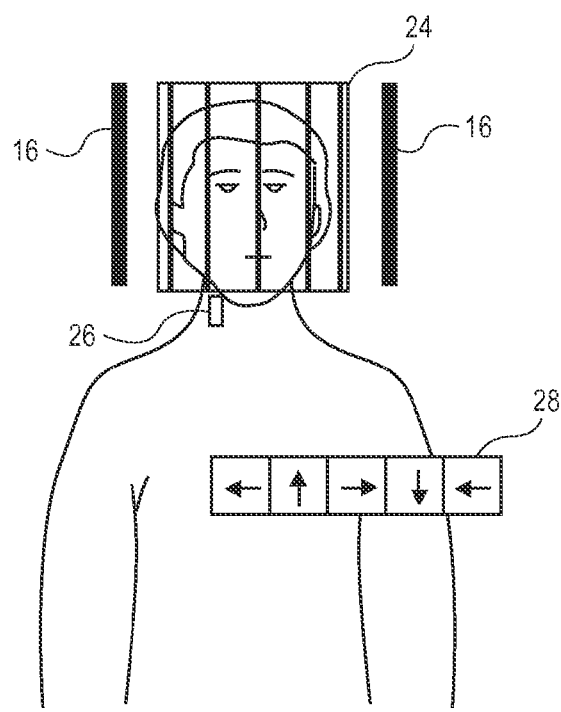

In low field applications, where large superconducting magnets are not employed, the flowing blood is prepolarized upstream of the brain (e.g. at the heart using permanent magnets). In the embodiment of FIG. 3B, a Halbach arrangement 28 can be used. Typically the provided magnetic field strength of these magnets is in the order of about 0.5 to 2 Tesla, and related to the remnant field of the permanent magnetic materials. In general, by using more sensitive detectors, relatively small magnets can be used in the polarization step in the area of the heart where there is relatively quick transport of blood to the brain. While the Halbach arrangement is used in one embodiment, it is to be appreciated that other forms of permanent magnets can be used to produce the required prepolarizing fields, such as single block magnets, or electromagnets. In addition, while in one embodiment blood from the heart is prepolarized, the prepolarization step can take place at other convenient body locations. Prepolarization may be performed at the brain by means of permanent magnets or pulsed electromagnetic fields.

As with high field systems, the encoding is carried out using RF and/or gradient pulses. Referencing now FIG. 2A, a pulsed signal is sent to an RF antenna 24 which surrounds a section of subject 22 to be imaged. The exemplary coil of the illustration comprises a Plexiglas cylinder onto which copper tape has been attached to create a "bird cage" type coil. Without more, the pulsing of the coil will effect a non-selective excitation, such non-selective excitation resulting in a generalized single inversion pulse.

In an embodiment, one or more gradient coils are used to provide localized slice or voxel inversion. Typically, X, Y, and Z axis gradient coils are provided, the number of coils utilized dependent upon the nature of the information sought. FIGS. 3A and 3B illustrate of the placement of one sided gradient coils 16 to either side of die encoding RF head coil 24.

These gradient coils are able to image any volume within the head, using well-known MRI methods.

Optical Atomic Magnetometer and Other Sensors

For low field applications, highly sensitive detectors are especially desired. Suitable detectors include laser based detectors as described in U.S. Published Patent Application US 2007/0205767A1, which application is hereby incorporated by reference in its entirety. Such laser-based atomic magnetometer apparatus for measuring nuclear magnetic fields may comprise: a) a plurality of magnetic field sensing cells; b) a laser source optically coupled to the magnetic field sensing cells; and, c) a signal detector that measures laser light after being coupled to the magnetic field sensing cells. The response of the magnetization field sensing cells to magnetic field causes changes to polarization of the laser light, which in turn can be measured by the signal detector. Typically, the magnetic field sensing cells are alkali cells, which operate at room temperature or above (detector 20 of FIG. 1, located adjacent detection region 18).

In most configurations, the plurality of alkali cells comprises two cells that measure substantially the same magnetic field. This arrangement allows for a gradiometer configuration that permits common mode rejection of ambient magnetic fields. Other gradiometer arrangements which may be selected for example include: a) more than two cells substantially arranged to form a higher order gradiometer; b) an array of alkali cells for substantially simultaneous detection; and c) an ambient magnetic field measuring cell in conjunction with one or more distant measurement cells. When higher order cell configurations are used, the magnetic field of the sample being measured may be determined by Gaussian interpolation, or other standard numerical interpolation techniques.

Highly sensitive magnetometers may also be used for detection, such as those based on the giant magneto resistance (GMR) effect, such as described in our copending U.S. patent application Ser. No. 12/753,306 filed Apr. 2, 2010. For low frequency signals, the ability of such detectors to detect magnetization is much higher than with conventional Faraday induction coils. A further advantage in using such a magnetometer for the sensor is that pulsing is not required at the point of detection.

Documents Incorporated by Reference

The following documents are hereby incorporated by reference and were included as part of U.S. Provisional Patent Application 61/013,951, filed on Dec. 14, 2007, which is referenced above under the heading of "RELATED APPLICATIONS."

a) Unsolicited Research Proposal for Earths Field MRI Scanner Based on Laser-Atomic Magnetometer, submitted To DARPA Jul. 13, 2007 [First 24 of 46 pages].

b) Unpublished paper entitled Laser-detected Magnetic Resonance Imaging for Medicine, Inventors: Alexander Pines, et al [3 pages]

c) Published paper entitled Magnetic Resonance Imaging with an Optical Atomic Magnetometer, Shoujun Xu, et al. [4 pages]

d) Unpublished paper entitled Magnetic Resonance Imaging of Living Systems by Remote Detection, Inventors: Alexander Pines, et. al. [5 pages]

e) U.S. Published Patent Application No.: US 2007/0205767 A1., published Sep. 6, 2007, Shoujun Xu, et al.

CONCLUSION

The remote detection methodology of this invention measures flow in the body of blood by its time of arrival at a remote location, using a detector placed in the remote location that provides high detection sensitivity. This MRI approach can apply to almost any body part, provided the nuclear spins have been encoded. The imaging can be performed in high or low magnetic fields using conventional MRI detectors, optical atomic magnetometers or other very sensitive magnetometers.

This invention has been described herein in considerable detail to provide those skilled in the art with information relevant to apply the novel principles and to construct and use such specialized components as are required. However, it is to be understood that the invention can be carried out by different equipment, materials and devices, and that various modifications, both as to the equipment and operating procedures, can be accomplished without departing from the scope of the invention itself.

What we claim is:

1. A method of conducting MRI of a human or animal subject comprising:
  (a) polarizing nuclei spin of atoms in blood of the subject to form spin polarized blood;
  (b) encoding the spin polarized blood in a first region of the subject to form encoded blood;
  (c) positioning a sensor proximate a second region of the subject, the second region being separate from the first region;
  (d) forming a detection signal of a degree of magnetization of the encoded blood as it flows past the sensor; and
  (e) constructing an image of the first region of the subject from the detection signal.

2. The method of claim 1 wherein the first region of the subject is a brain and the second region of the subject is a jugular vein.

3. The method of claim 2 wherein the sensor is positioned proximate a surface of skin of the subject proximate the jugular vein.

4. The method of claim 1 wherein operation (a) is performed in the first region of the subject.

5. The method of claim 4 wherein operation (a) is performed within a core of a superconducting magnet.

6. The method of claim 5 wherein a magnetic field strength of the superconducting magnet is about 0.5 Tesla to 9 Tesla.

7. The method of claim 1 wherein operation (a) is performed at a third region of the subject separate from and upstream of the first region of the subject.

8. The method of claim 7 wherein operation (a) is performed proximate to a heart of the subject.

9. The method of claim 8 wherein operation (a) comprises placing a permanent magnet proximate the heart.

10. The method of claim 9 wherein the permanent magnet comprises a Halbach magnet array.

11. The method of claim 10 wherein the Halbach magnet array has a magnetic field strength of at least about 0.5 Tesla.

12. The method of claim 1 wherein the sensor is a magnetoresistive sensor.

13. The method of claim 1 wherein the sensor is a giant magnetoresistive sensor.

14. The method of claim 1 wherein the sensor is an optical atomic magnetometer.

15. The method of claim 1 wherein operation (b) comprises application of an RF pulse.

16. The method of claim 15 wherein the RF pulse is provided using an RF coil which surrounds a head of the subject.

17. The method of claim 15 wherein the RF pulse is applied under an influence of one or more gradient fields.

18. The method of claim 15 wherein the RF pulse is applied under the influence of a gradient along a Z axis.

19. The method of claim 15 wherein the RF pulse if is applied in the presence of a gradient either in the direction of an X axis, a Y axis, or simultaneously in the direction of both the X and Y axes.

20. The method of claim 1 wherein the sensor is a coil.

21. The method of claim 1 wherein the sensor is a Faraday induction coil.

22. The method of claim 21 wherein the Faraday induction coil is alternatively pulsed for a period of time to change the spin alignment of the polarized blood as it flows past, and wherein the Faraday induction coil is then operated in a detection mode.

23. The method of claim 21 wherein the Faraday coil surrounds a space that is of a similar dimension to that a dimension of a jugular vein of the subject.

24. The method of claim 1 wherein operation (b) further comprises storing encoded spins as longitudinal magnetization.

25. A method of conducting MRI of a brain of a human or animal subject comprising:
  polarizing nuclei spin of atoms in blood of the subject to form spin polarized blood;
  encoding the spin polarized blood in the brain to form encoded blood;
  positioning a sensor proximate a jugular vein of the subject;
  forming a detection signal of a degree of magnetization of the encoded blood as it flows past the sensor; and
  constructing an image of the brain from the detection signal.

* * * * *